(12) United States Patent
Rittinger et al.

(10) Patent No.: US 12,270,732 B2
(45) Date of Patent: Apr. 8, 2025

(54) METHOD AND APPARATUS FOR DETERMINING UPVALUE FACTORS FOR EXPANSION MEASUREMENTS ON MACHINE ELEMENTS

(71) Applicant: MTU Aero Engines AG, Munich (DE)

(72) Inventors: David Rittinger, Munich (DE); Ulrich Retze, Munich (DE); Joerg Reschke, Munich (DE); Wilhelm Meir, Munich (DE); Michael Junge, Munich (DE); Stefan Schwarz, Munich (DE)

(73) Assignee: MTU Aero Engines AG, Munich (DE)

( * ) Notice: Subject to any disclaimer, the term of this patent is extended or adjusted under 35 U.S.C. 154(b) by 138 days.

(21) Appl. No.: 17/783,797

(22) PCT Filed: Dec. 8, 2020

(86) PCT No.: PCT/DE2020/000322
§ 371 (c)(1),
(2) Date: Jun. 9, 2022

(87) PCT Pub. No.: WO2021/115512
PCT Pub. Date: Jun. 17, 2021

(65) Prior Publication Data
US 2023/0008848 A1    Jan. 12, 2023

(30) Foreign Application Priority Data
Dec. 11, 2019  (DE) .................. 10 2019 219 387.0

(51) Int. Cl.
*G01M 5/00*    (2006.01)
*G01B 11/16*   (2006.01)
*G06F 30/23*   (2020.01)

(52) U.S. Cl.
CPC .......... *G01M 5/0041* (2013.01); *G01B 11/16* (2013.01); *G01M 5/0091* (2013.01); *G06F 30/23* (2020.01); *G01M 5/0066* (2013.01)

(58) Field of Classification Search
None
See application file for complete search history.

(56) References Cited

U.S. PATENT DOCUMENTS 9,239,277 B2    1/2016  Erdman, III et al.
9,852,330 B1   12/2017  Shannon
(Continued)

FOREIGN PATENT DOCUMENTS

DE       10105994 A1 *  9/2002  ............ G01B 11/16
DE     102011011392 A1   8/2012
(Continued)

OTHER PUBLICATIONS

M. Banther, Yuhong Huang and W. C. Messner, "Optimal strain gauge placement for an instrumented disk drive suspension," Proceedings of the 1998 American Control Conference. ACC (IEEE Cat. No. 98CH36207), Philadelphia, PA, USA, 1998, pp. 3023-3027 vol. 5, doi: 10.1109/ACC.1998.688412. (Year: 1998).*

(Continued)

*Primary Examiner* — Michael J Dalbo
*Assistant Examiner* — Denise R Karavias
(74) *Attorney, Agent, or Firm* — Hinckley, Allen & Snyder, LLP; David Josephs

(57) ABSTRACT

The present invention relates to an apparatus and a method for determining a scaling factor for a strain measurement in a machine element, comprising steps for measuring a strain in a measurement surface portion by means of a strain measuring device; for measuring a displacement of a detection surface portion of the machine element by an optical scanning; for determining a displacement field on a surface (Continued)

Figure 1:
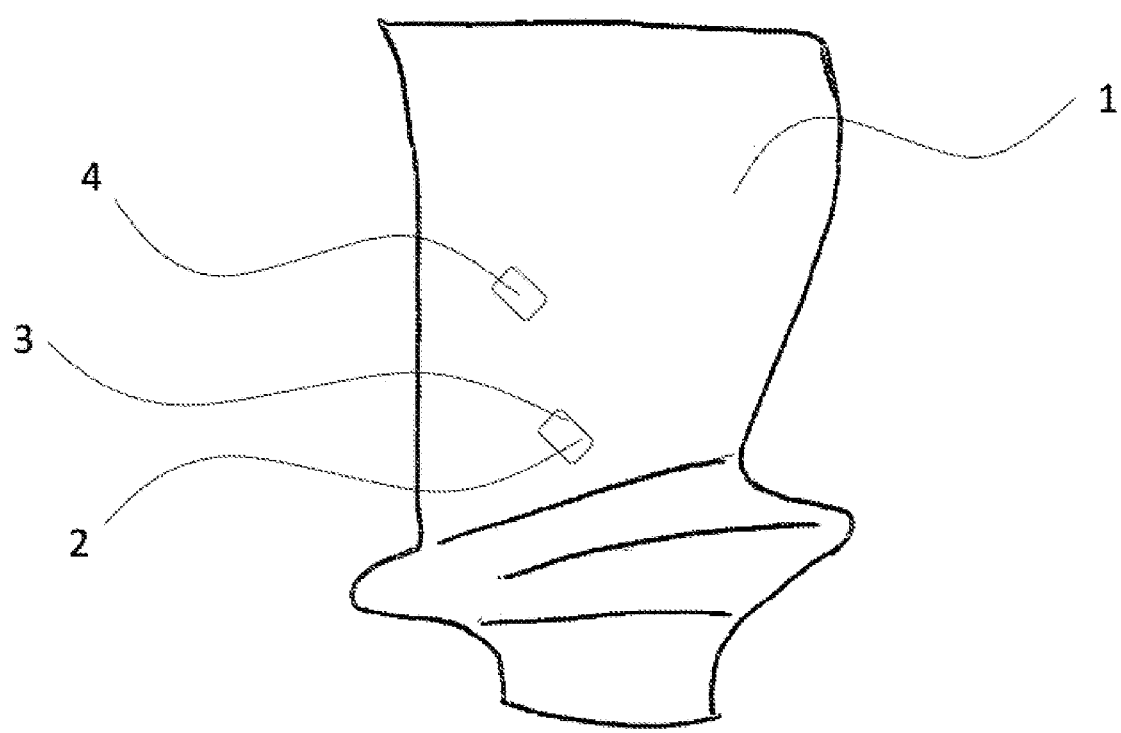

of the machine element on the basis of a model of the machine element and the measured displacement of the at least one detection surface portion; for determining a strain field on the surface of the machine element on the basis of the determined displacement field and the model of the machine element; and for determining a scaling factor of the strain measuring device on the basis of the determined strain field and the measured strain in the measurement surface portion.

8 Claims, 2 Drawing Sheets

(56) References Cited

U.S. PATENT DOCUMENTS

| | | | |
|---|---|---|---|
| 2003/0126930 A1 | 7/2003 | De La Puente et al. | |
| 2008/0188744 A1 | 8/2008 | Fan et al. | |
| 2008/0249722 A1* | 10/2008 | Meitzner | G01M 7/025 |
| | | | 702/42 |
| 2010/0091659 A1* | 4/2010 | O'Hanlon | H03M 13/09 |
| | | | 370/255 |
| 2012/0147384 A1* | 6/2012 | Swiergiel | G01M 5/0091 |
| | | | 356/614 |
| 2012/0266680 A1* | 10/2012 | Boyer | G01B 11/2545 |
| | | | 73/655 |
| 2014/0032133 A1* | 1/2014 | Popineau | G01M 99/00 |
| | | | 702/33 |
| 2014/0229136 A1* | 8/2014 | Reth | G01C 25/005 |
| | | | 702/96 |
| 2016/0305769 A1* | 10/2016 | Burnside | G01B 11/165 |
| 2017/0314118 A1* | 11/2017 | Shen | C23C 24/04 |
| 2020/0182715 A1* | 6/2020 | Fyfe | G01L 1/242 |

FOREIGN PATENT DOCUMENTS

| | | |
|---|---|---|
| DE | 102016108991 A1 | 11/2017 |
| EP | 1922537 B1 | 10/2009 |
| FR | 2956734 A1 | 8/2011 |

OTHER PUBLICATIONS

Klauke, Thomas, "Blade vibrations of real integral compressor wheels with regard detuning and localization," Faculty of Mechanical, Electrical and Industrial Engineering from the Bradenburg Technical University of Cottbus, Dissertation TU Cottbus S.114, Dec. 14, 2007.

Institute of Turbomachinery and Fluid Dynamics, "Tip Timing," Leibniz University Hannover, Jan. 20, 2015, https://www.tfd.uni-hannover.de/bssm2.html.

Frey, Torsten, "Thesis—Use of a laser vibrometer for measuring on standing and rotating structures," FHD University of Applied Sciences, Dusseldorf, May 16, 2000.

Carr, Jennifer et al., "Dynamic Stress-Strain on Turbine Blade Using Digital Image Correlation Techniques Part 1: Static Load and Calibration," In: Mayes, R. L. et al., Topics in Experimental Dynamics Substructuring and Wind Turbine Dynamics, Chapter 20, vol. 2, Conference Proceedings of the Society for Experimental Mechanics Series 27, 2012.

* cited by examiner

METHOD AND APPARATUS FOR DETERMINING UPVALUE FACTORS FOR EXPANSION MEASUREMENTS ON MACHINE ELEMENTS

BACKGROUND OF THE INVENTION

The present invention relates to a method and an apparatus for determining scaling factors for strain measurements on machine elements.

For validating the design of engine blades or vanes in terms of vibration mechanics, the dynamic loads placed on rotor elements in the rig/engine have hitherto been measured in the developmental phase by strain gauges (SG). This experimental proof is absolutely essential for certification of the components. Because the number of measurement points in an engine is limited and the SG for the large number of vibrational patterns to be measured cannot be applied at the positions of maximum vibrational load, the work is carried out with a substantially reduced number of SGs. These are specifically aligned in such a way that the individual sensors of a certain quantity of vibrational patterns detect a part of the mechanical load, but very seldom the maximum mechanical load.

The conventional way of deriving the maximum vibrational load of the individual vibrational patterns from these measurement positions takes place via an experimental calibration of the blades in the laboratory. In this case, in tedious laboratory analyses, factors are determined for the individual SGs and are used to multiply the values measured in the rig/engine in order to be able to arrive at the actual maximum vibrational strain. For these laboratory analyses, a large number of additional laboratory SGs are applied on the body of the blade in the respective strain maximum of the individual modes.

This procedure in the case of this conventional determination of scaling factors, however, is costly, time-intensive, and in part inaccurate.

In the case of the conventional determination of scaling factors for machine elements/components, the maximum strains are measured only at very local sites (laboratory SG positions). These sites were defined beforehand by way of finite element calculations. Problematic here is that the position of the maximum strain is established purely by calculations. In reality, however, the position of maximum strain may be displaced on account of geometric deviations, for example. Accordingly, especially in the case of large strain gradients, the value determined by the laboratory SG can deviate markedly from the maximum strain.

A further problem is the difficulty of applying the SG exactly on a defined position and alignment. Accordingly, then, it is even difficult to measure the maximum strain by means of SGs when the position and alignment thereof are known exactly.

DE 10 2011 011 392 A1 discloses a device for the optical measurement of deformations of a rotor blade of a wind turbine, wherein a camera is directed at a reference position of an optically detectable deformation marking. Deviations from the reference position are determined and quantified.

The Ph.D. thesis "*Schaufelschwingungen realer integraler Verdichterräder im Hinblick auf Verstimmung and Lokalisierung*" (Blade vibrations of real integral compressor wheels with respect to detuning and localization) by Thomas Klauke in the Faculty for Mechanical Engineering, Electrical Engineering, and Industrial Engineering of Brandenburg Technical University Cottbus discloses an application of a film SG to a rotor based on a blade bending mode.

EP 1 922 537 B1 discloses a method for determining a strain distribution on gas turbine components by a vibrational excitation of the component and the metrological recording of a vibrational amplitude distribution of the component for a large number of measurement points by means of a vibrometer as well as by a calculation of a tensorial strain state and a strain distribution.

SUMMARY OF THE INVENTION

An object of the present invention is to improve a method and an apparatus for determining a scaling factor for a strain measurement in a machine element.

This object is achieved by a method for determining a scaling factor for a strain measurement in a machine element and by an apparatus of the present invention. Advantageous embodiments of the invention are discussed in detail below.

In accordance with an aspect of the present invention, a method for determining a scaling factor for a strain measurement in a machine element, in particular in a blisk, comprises the following steps: placing a strain measurement device on a measurement surface portion of the machine element; bringing about a static or dynamic deformation of the machine element; measuring a strain in the measurement surface portion by use of the strain measurement device; measuring a displacement of at least one detection surface portion of the machine element that differs from the measurement surface portion of the machine element, in particular by optical scanning of the machine element; determining a displacement field on a surface of the machine element on the basis of a model of the machine element and the measured displacement of the at least one detection surface portion; determining a strain field on the surface of the machine element on the basis of the determined displacement field and the model of the machine element; determining a scaling factor of the strain measurement device on the basis of the measured strain in the measurement surface portion and the determined strain field.

Preferably, the scaling factor is a ratio of a maximum strain in the strain field and the measured strain in the measurement surface portion.

The method according to the invention employs an optical measurement technique by means of which the displacements on the blade body are detected without contact and in a subportion of the surface. Preferably, a plurality of detection surface portions are present, so that a large-area displacement field of the rotor element that is composed of the detection surface portions is determined, and from which, as described in the previous section, the preferably large-area strain field can be determined. The great advantage thereof lies in the fact that, in this way, vibrations of the machine element on a subportion of the surface, that is, that of the detection surface portion, are optically scanned and not just at a few, very local positions, as was the case in the prior art for the SGs put in place additionally in the laboratory. The method according to the invention uses, in addition, optical measurement methods that are capable of measuring with high sensitivity the spatial vibrational movement of the component, as a result of which the validity and the accuracy of the scaling factor is increased. For this purpose, it is possible to use a planar optical scanning, in particular by laser vibrometry, or an image correlation method is used. In this way, it is also possible to shorten the turnaround times for determining the scaling factor for compressor blisks.

Preferably, the model of the machine element is created on the basis of nominal data and/or, in particular, by way of data acquired by reverse engineering and/or has finite elements. Further preferably, the model of the machine element is a validated finite element model of the machine element. A validated finite element model ensues from the successful passage of a validation process in which it is demonstrated that the model is sufficiently precise for the intended use within the scope of its field of application.

Preferably, the method has a step for determining the measurement surface portion and/or the detection surface portion and an orientation of the strain measurement device on the measurement surface portion based on the model of the machine element. Further preferably, the method has a step for determining vibrational modes of the machine element on the basis of the model of the machine element, with the measurement surface portion and the orientation of the strain measurement device on the measurement surface portion being determined, in addition, based on the determined vibrational modes. In this way, it is possible to improve the validity of the scaling factor still further.

In accordance with another aspect of the present invention, an apparatus for determining a scaling factor for a strain measurement in a machine element has a strain measurement device, which is configured in such a way so as to be placed on a measurement surface portion of the machine element; a means that is configured in such a way so as to bring about a static or dynamic deformation of the machine element; a means that is configured in such a way so as to measure a strain in the measurement surface portion by the strain measurement device; a means that is configured in such a way so as to measure a displacement of at least one detection surface portion of the machine element that differs from the measurement surface portion, in particular by optical scanning of the machine element; a means that is configured in such a way so as to determine a displacement field on a surface of the machine element on the basis of a model of the machine element and the measured displacement of the at least one detection surface portion; a means that is configured in such a way so as to determine a strain field on the surface of the machine element on the basis of the determined displacement field and the model of the machine element; and a means that is configured in such a way so as to determine a scaling factor of the strain measurement device on the basis of the measured strain in the measurement surface portion and the determined strain field. The apparatus according to the invention achieves the same advantages as the aforementioned method according to the invention.

A means in the intendment of the present invention can be designed in terms of hardware and/or software technology and, in particular, preferably can have a digital processing unit, in particular a microprocessor unit (CPU), which is preferably data-linked and signal-linked to a memory storage and/or bus system, and/or one program or program module or a plurality of programs or program modules. The CPU can be designed so as to process commands that are executed as a program stored in a memory storage system in order to receive input signals from a data bus and/or to emit output signals to a data bus. A memory storage system can have one storage medium or a plurality of, in particular, different storage media, particularly optical, magnetic, hard-disk, and/or other nonvolatile media. The program can be created in such a way that it embodies the method described here or is capable of implementing it, so that the CPU can perform the steps of such a method.

In an embodiment, one step or a plurality of steps and, in particular, all steps of the method is or are carried out in fully or partially automated manner, in particular by the apparatus or by its means.

BRIEF DESCRIPTION OF THE DRAWING FIGURES

Figure 2:
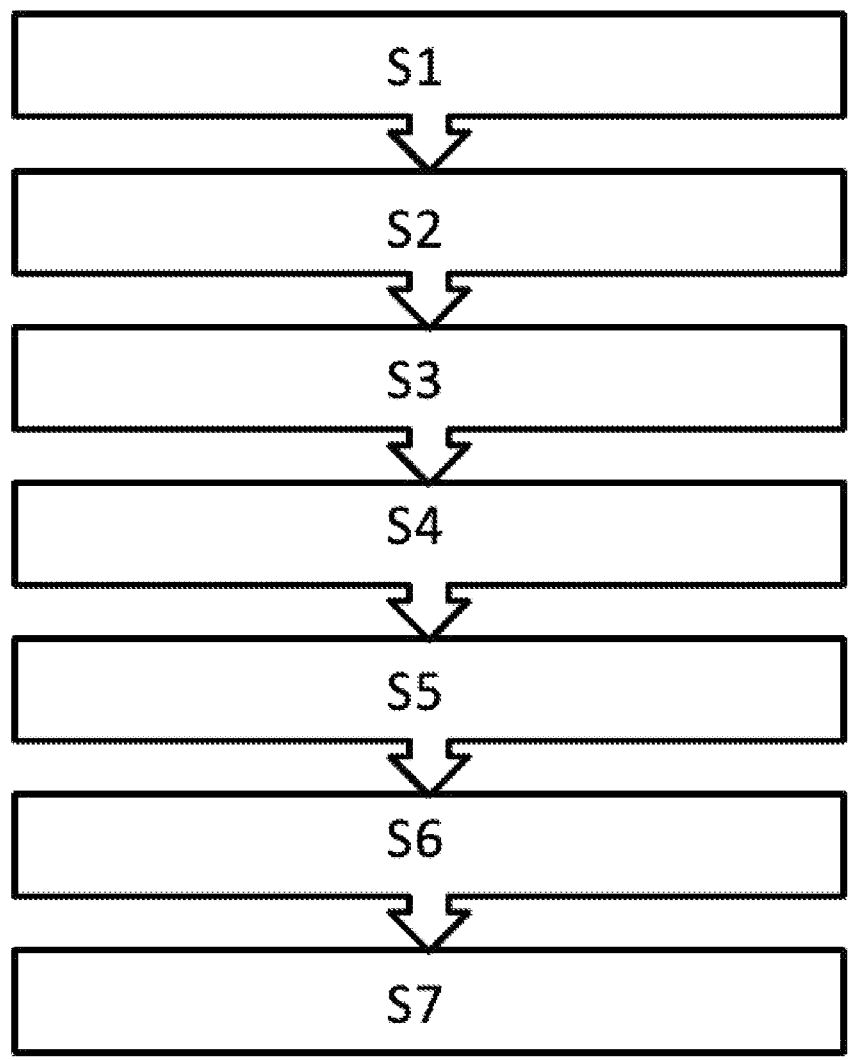

Other advantageous further developments of the present invention ensue from the dependent claims and the following description of preferred embodiments. Shown to this end in a partially schematic manner are:

FIG. 1 shows a machine element, for which a scaling factor for a strain measurement in accordance with an embodiment of the present invention is determined; and FIG. 2 shows a flow chart of a method for determining the scaling factor for a strain measurement for the machine element.

DESCRIPTION OF THE INVENTION

FIG. 1 shows a machine element 1, for which a scaling factor for a strain measurement is determined in accordance with a first embodiment of the present invention, and FIG. 2 shows a flow chart of a method for determining the scaling factor for a strain measurement for the machine element 1. In the case of the illustrated machine element 1, what is involved, by way of example, is a rotor blade of a blisk for a gas turbine.

In a first step S1, a strain measurement device 2 is placed on a measurement surface portion 3 of the machine element 1. The strain measurement device 2 can be a mechanical strain gauge.

In the following step S2, a static or dynamic deformation of the machine element 1 is brought about. It is thereby possible to introduce a vibration or a static force in the machine element 1 by means of an excitation system or actuator.

In the following step S3, a strain in the measurement surface portion 3 is measured by use of the strain measurement device 2.

In the following step S4, a displacement of at least one detection surface portion 4 of the machine element 1 that differs from the measurement surface portion 3 is measured: This measurement can take place by way of a planar optical scanning of the machine element 1, such as, for example, by means of laser vibrometry or by an image correlation method. It is conceivable that, in the region of the measurement surface portion 3, it is not possible to measure any suitable displacements. In this case, it is possible to provide a recess in the measurement surface portion 3, in which the strain measurement device 2 can be inserted.

In the following step S5, a displacement field on a surface of the machine element 1 is determined on the basis of a model of the machine element 1 and the measured displacement of the at least one detection surface portion 4. Preferably, the displacement field covers the full area.

In the following step S6, a strain field is determined on the basis of the determined displacement field and the model of the machine element 1. Preferably, the strain field covers the full area.

In the following step S7, a scaling factor of the strain measurement device 2 is determined in the measurement surface portion 3 on the basis of the determined strain field and the measured strain. The scaling factor is preferably determined as a ratio of a maximum strain in the strain field and the measured strain in the measurement surface portion 3.

The model of the machine element 1 can be created based on nominal data and/or, in particular, based on data acquired by reverse engineering. In the case of nominal data, a CAD file may be involved. The data acquired by reverse engineering can be obtained, for example, by a three-dimensional optical scanning of the physical machine element 1 by way of white-light interferometry. The advantage of the model obtained by reverse engineering lies in the fact that manufacturing deviations that the machine element 1 has in comparison to the data of a CAD file are not taken into consideration.

Good results can be obtained when the model of the machine element 1 is a validated model of the machine element 1. The validation can be conducted, for example, in such a way that a calculated strain is compared to a measured strain.

The measurement and/or detection surface portions 3, 4 and an orientation of the strain measurement device 2 on the measurement surface portion 3 can be determined in a specific manner on the basis of the model of the machine element 1, for example, in order to measure or determine a load or amplitude of the largest size possible. Further preferably, vibrational modes of the machine element 1 can be determined on the basis of the model of the machine element 1, with the measurement surface portion 3 and the orientation of the strain measurement device 2 on the measurement surface portion 3 being determined in addition on the basis of the determined vibrational modes.

FIG. 1 depicts the method according to the invention merely schematically with only one respective measurement and detection surface portion 3, 4 in each instance. In practice, a plurality of measurement and/or detection surface portions 3, 4 can be present.

An apparatus according to the invention for carrying out the method according to the invention comprises the strain measurement device 2, such as, for example, the SG, which is configured in such a way so as to be placed on the measurement surface portion 3 of the machine element 1; a means, such as, for example, the excitation system or the actuator, which is configured in such a way so as to bring about a static or dynamic deformation of the machine element 1; a means, such as, for example, a computation device, which is configured in such a way so as to measure a strain in the measurement surface portion 3 by the mechanical strain measurement device 2; a means, such as, for example, an optical scanning apparatus, which is configured in such a way so as to measure a displacement of the at least one detection surface portion 4 of the machine element 1 that differs from the measurement surface portion 3; a means, such as, for example, the computation device, which is configured in such a way so as to determine a displacement field on a surface of the machine element 1 on the basis of a model of the machine element 1 and the measured displacement of the at least one detection surface portion 4; a means, such as, for example, the computation device, which is configured in such a way so as to determine a strain field on the surface of the machine element 1 on the basis of the determined displacement field and the model of the machine element 1; and a means, such as, for example, the computation device, which is configured in such a way so as to determine a scaling factor of the strain measurement device 2 on the basis of the determined strain field and the measured strain in the strain surface portion 3.

Although, in the above description, exemplary embodiments were explained, it is noted that a large number of modifications are possible. Moreover, it is noted that the exemplary embodiments involve merely examples, which are not intended to limit the protective scope, the applications, and the structure in any way. Instead, the person skilled in the art will be afforded a guide for the implementation of at least one exemplary embodiment by way of the preceding description, whereby diverse changes, in particular in regard to the function and arrangement of the described component parts, can be made, without leaving the protective scope as ensues from the claims and combinations of features equivalent to these.

What is claimed is:

1. A method for determining a scaling factor for a strain measurement in a machine element, comprising the following steps:
   placing a strain measurement device on a measurement surface portion of the machine element;
   bringing about a static or dynamic deformation of the machine element;
   while the static or dynamic deformation of the machine element is being brought about, measuring a strain in the measurement surface portion by use of the strain measurement device;
   while the static or dynamic deformation of the machine element is being brought about, measuring a displacement of at least one detection surface portion of the machine element that differs from the measurement surface portion by optical scanning of the machine element;
   determining a displacement field on a surface of the machine element on the basis of a model of the machine element and the measured displacement of the at least one detection surface portion;
   determining a strain field on the surface of the machine element on the basis of the determined displacement field and the model of the machine element; and
   determining a scaling factor from the strain measurement device on the basis of the measured strain in the measurement surface portion and the determined strain field; the scaling factor being a ratio of a strain in the strain field and the measured strain in the measurement surface portion.

2. The method according to claim 1, wherein the model of the machine element is created on the basis of nominal data and/or, in particular, data acquired by reverse engineering and/or has finite elements.

3. The method according to claim 1, wherein the model of the machine element is a validated finite element model.

4. The method according to claim 1, further comprising the step of:
   determining the measurement and/or detection surface portions and an orientation of the strain measurement device on the measurement surface portion on the basis of the model of the machine element.

5. The method according to claim 1, further comprising the step of:
   determining vibrational modes of the machine element on the basis of the model of the machine element, wherein the measurement surface portion and the orientation of the strain measurement device on the measurement surface portion are determined additionally on the basis of the determined vibrational modes.

6. The method according to claim 1, wherein the step for measuring the displacement of the at least one detection surface portion has a planar optical scanning, in particular by laser vibrometry or an image correlation method.

7. The method according to claim 1, wherein the machine element is a rotor blade of a gas turbine and/or a blisk.

8. A device for determining a scaling factor for a strain measurement in a machine element, comprising:
   a strain measurement device, configured and arranged to be placed on a measurement surface portion of the machine element;

an excitation system or actuator to bring about a static or dynamic deformation of the machine element;

a strain measurement device to measure a strain in the measurement surface portion;

an optical scanner to measure a displacement of at least one detection surface portion of the machine element that differs from the measurement surface portion;

a computational device configured and arranged to determine a displacement field on a surface of the machine element on the basis of a model of the machine element and the measured displacement of the at least one detection surface portion;

the computational device configured and arranged to further determine a strain field on the surface of the machine element on the basis of the determined displacement field and the model of the machine element; and wherein the scaling factor from the strain measurement device is determined on the basis of the measured strain in the measurement surface portion and the determined strain field.

* * * * *